United States Patent [19]
Matsuoka

[11] Patent Number: 5,292,266
[45] Date of Patent: Mar. 8, 1994

[54] INTEGRATED CIRCUIT CARRIER

[75] Inventor: Noriyuki Matsuoka, Yokohama, Japan

[73] Assignee: Yamaichi Electronics Co., Ltd., Tokyo, Japan

[21] Appl. No.: 999,142

[22] Filed: Dec. 31, 1992

[30] Foreign Application Priority Data

Mar. 12, 1992 [JP] Japan .................................. 4-087473

[51] Int. Cl.[5] .............................................. H05K 1/00
[52] U.S. Cl. ........................................ 439/526; 439/70
[58] Field of Search ....................... 439/68, 70, 71, 72, 439/73, 266, 525, 526, 931

[56] References Cited

U.S. PATENT DOCUMENTS

| | | | |
|---|---|---|---|
| 3,407,925 | 10/1968 | Ruehlemann | 439/526 X |
| 3,529,277 | 9/1970 | Barnes | 439/526 |
| 3,652,974 | 3/1972 | Tems | 439/526 |
| 4,236,777 | 12/1980 | Merlina et al. | 439/71 |
| 4,329,642 | 5/1982 | Luthi et al. | 439/71 X |
| 4,918,513 | 4/1990 | Kurose et al. | 439/331 X |

FOREIGN PATENT DOCUMENTS 58-56444  4/1983  Japan .

Primary Examiner—Neil Abrams
Assistant Examiner—Khiem Nguyen
Attorney, Agent, or Firm—Wenderoth Lind & Ponack

[57] ABSTRACT

An electrical conductive pattern is deposited on the surface of a frame constituting an integrated circuit carrier. To enable leads extending from an integrated circuit package to come in contact with the electrical conductive pattern, a plurality of first contact portions are formed on the inner end of the electrical conductive pattern. In addition, to enable a plurality of contact pieces extending from an integrated circuit socket to come in contact with the conductive pattern, a plurality of second contact portions are formed on the outer end of the electrical conductive pattern. Thus, the leads extending from the integrated circuit package are reliably brought into electrical contact with the contact pieces via the first contact portions, the electrical conductive pattern and the second contact portions. The arrangement of the electrical conductive pattern in that way makes it possible that the leads can be spaced from each other at an interval smaller than an interval between adjacent contact pieces.

3 Claims, 5 Drawing Sheets

INTEGRATED CIRCUIT CARRIER

BACKGROUND OF THE INVENTION

The present invention relates generally to an integrated circuit (IC) carrier. More particularly, the present invention relates to an IC carrier which assures reliable contact between an IC package and an IC socket when the IC package is carried by the IC carrier when it is installed in the IC socket.

Basically, the IC carrier serves to protect a main body of each IC package and contact pieces extending from the same when the IC package is handled during transportation, measuring or the like. A typical fundamental structure of an IC carrier is disclosed in Japanese Patent Laid-Open Publication No. Sho 58-56444. According to this prior art, the IC carrier includes a square frame having a small thickness and the central part having an IC receiving portion. When an IC package is received in the IC receiving portion, a plurality of leads projecting sideward of the IC package are individually received in the corresponding slots formed in the surface of the frame of the integrated circuit carrier, and a plurality of locking pawls arranged along the peripheral edge of the integrated circuit receiving portion are engaged with the integrated circuit package so that the integrated circuit package is carried by the IC carrier when it is received in the integrated circuit receiving portion. Subsequently, when the IC carrier having the IC package carried thereby is installed on an IC socket, a plurality of contacts extending from the IC package are brought in contact with leads in the slots.

In the case where the leads extending from the IC package are arranged in spaced relationship at a comparatively large interval between adjacent leads, the contact pieces can be brought in electrical contact with the leads without any particular problem. In recent years, there has been a remarkable tendency that a plurality of leads extending from an IC package are spaced away from each other at a small intervals between adjacent leads. However, with the conventional IC carrier thus constructed, it becomes very difficult from the technical view point that a plurality of contact pieces are brought into direct contact with the corresponding slots spaced from each other at a very small interval which is needed to accommodate the foregoing latest tendency.

SUMMARY OF THE INVENTION

The present invention has been made in consideration of the aforementioned background.

It is therefore an object of the present invention to provide an IC carrier which assures that a plurality of leads extending from an IC package received in an IC circuit receiving portion of the IC carrier can reliably be brought into electrical contact with a plurality of contact pieces extending from an IC socket via a plurality of first contact portions and a plurality of second contact portions wherein the leads are spaced from each other at an interval much smaller than an interval between adjacent contact pieces.

According to the present invention, there is provided an IC carrier including a frame, an IC circuit receiving portion defined by the frame and a plurality of latch members adapted to be engaged with and disengaged from an IC circuit package received in the IC receiving portion wherein a plurality of leads extending from the IC package are held on the surface of the frame so that the IC package is carried by the IC carrier via the leads wherein an electrical conductive pattern is deposited on the surface of the frame, a plurality of first contact portions are formed on the inner end of the electrical conductive pattern for bringing the leads in contact with the electrical conductive pattern, and a plurality of second contact portions are formed on the outer end of the electrical conductive pattern for bringing a plurality of contact pieces extending from an IC socket in contact with the electrical conductive pattern, the contact pieces being spaced away from each other at an interval much larger than the interval between adjacent leads, whereby the leads are reliably brought into electrical contact with the contact pieces via the first contact portions, the electrical conductive pattern and the second contact portions.

Usually, the electrical conductive pattern extends from the surface portion along the inner edge of the frame to the outer peripheral surface of the same so that the first contact portions are formed on the leads on the inner end of the electrical conductive pattern and the second contact portions are formed for the contact pieces on the outer end of the same.

Alternatively, the electrical conductive pattern extends from the surface portion along the inner edge of the frame to the outer peripheral surface of the same so that the first contact portions are formed for the leads on the inner end of the electrical conductive pattern and the second contact portion are formed for the contact pieces on a part of the electrical conductive pattern located on the outer peripheral surface of the frame.

In addition, alternatively, the electrical conductive pattern extends from the surface portion along the inner edge of the frame to the upper surface portion of the same located opposite to the first-mentioned surface portion so that the first contact portions are formed for the leads on the inner end of the electrical conductive pattern and the second contact portions are formed for the contact pieces on a part of the electrical conductive pattern located on the upper surface portion of the frame.

Otherwise, the electrical conductive pattern extends from the surface portion along the inner edge of the frame to an inclined outer peripheral surface of the same so that the first contact portions are formed for the leads on the inner end of the electrical conductive pattern and the second contact portions are formed for the contact pieces on a part of the electrical conductive pattern located on the inclined outer peripheral surface of the frame.

It is important for the IC carrier that the first contact portions be spaced from each other at a small interval and the second contact portions be spaced from each other at a large interval larger than an interval between adjacent first contact portions.

It is likewise important for the IC carrier that each first contact portion is dimensioned to have a width smaller than that of each lead.

Consequently, the IC carrier constructed in the above-described manner makes it possible to sufficiently satisfy the latest requirement of users for reducing an interval between adjacent leads extending from the IC package as far as possible.

Other objects, features and advantages of the present invention will become apparent from the following description taken with reference to the accompanying drawings.

BRIEF DESCRIPTION OF THE DRAWINGS

The present invention is illustrated in the following drawings in which.

DESCRIPTION OF THE PREFERRED EMBODIMENT

The present invention will now be described in detail hereinafter with reference to the accompanying drawings which illustrates a preferred embodiment thereof.

Figure 1:
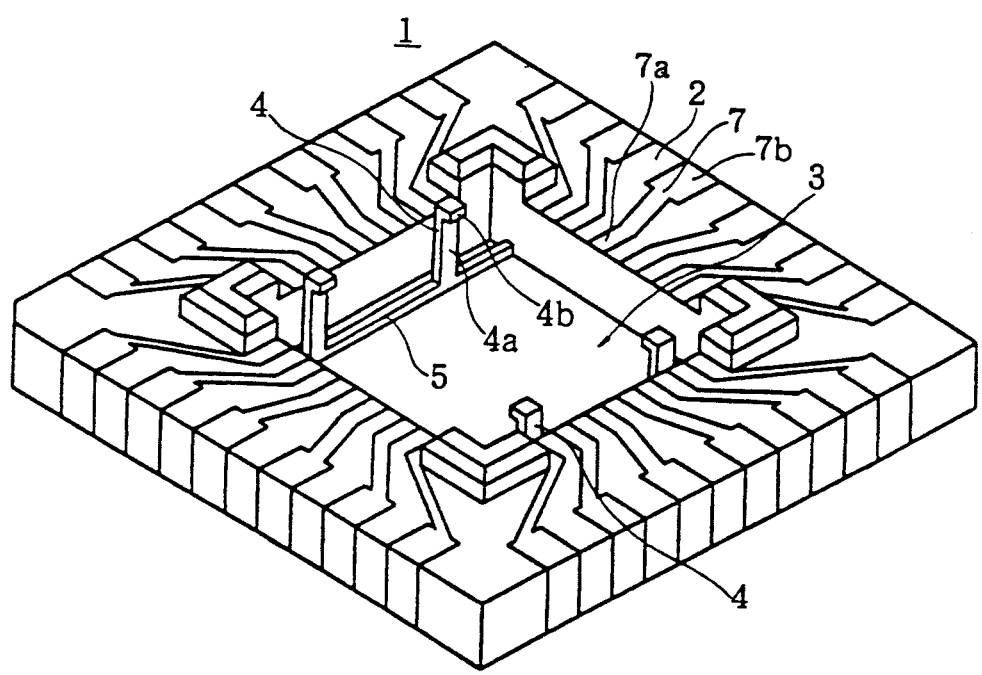
FIG. 1 is a perspective view of an IC carrier in accordance with one embodiment of the present invention.
Figure 2A:
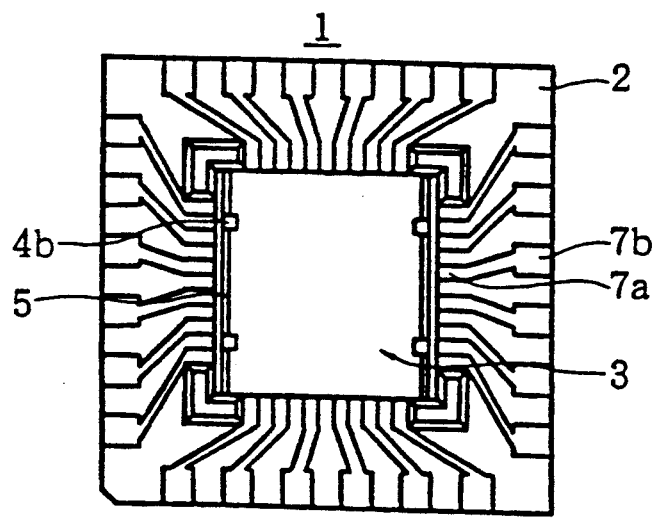
FIG. 2A is a plan view of the IC carrier shown in FIG. 1.
Figure 2B:
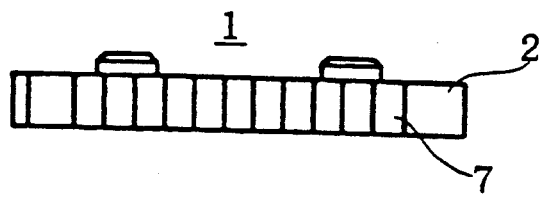
FIG. 2B is a side view of the IC carrier shown in FIG. 1.
Figure 2C:
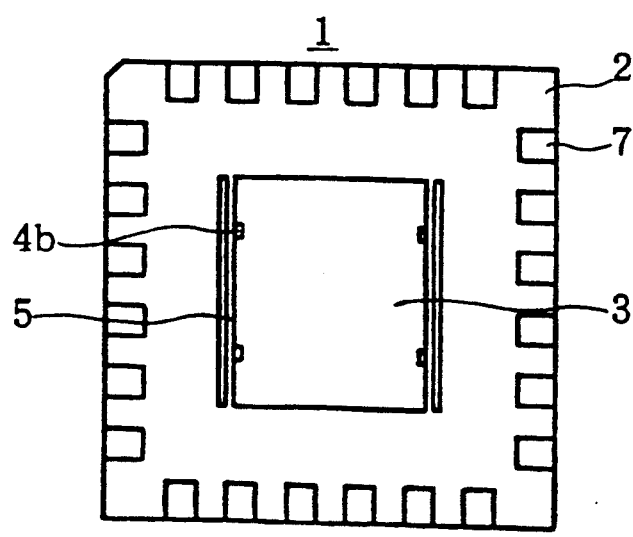
FIG. 2C is a plan view of the IC carrier shown in FIG. 1 as seen from the bottom side.
Figure 3:
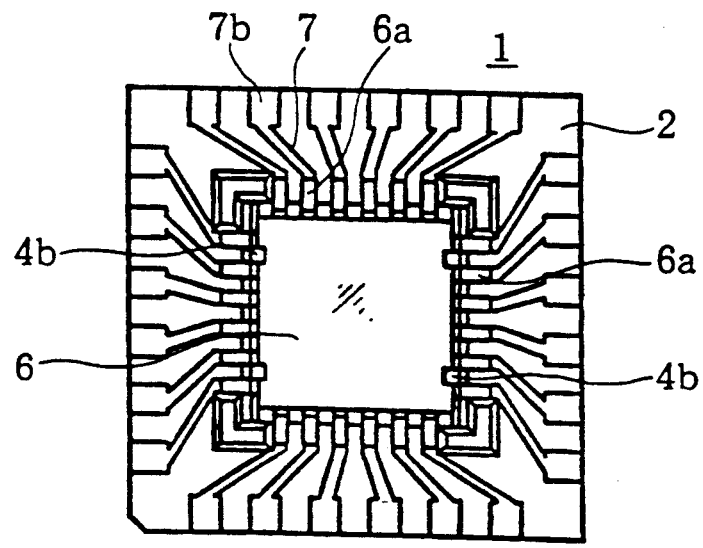
FIG. 3 is a plan view of the IC carrier by which an IC package is carried.
Figure 4:
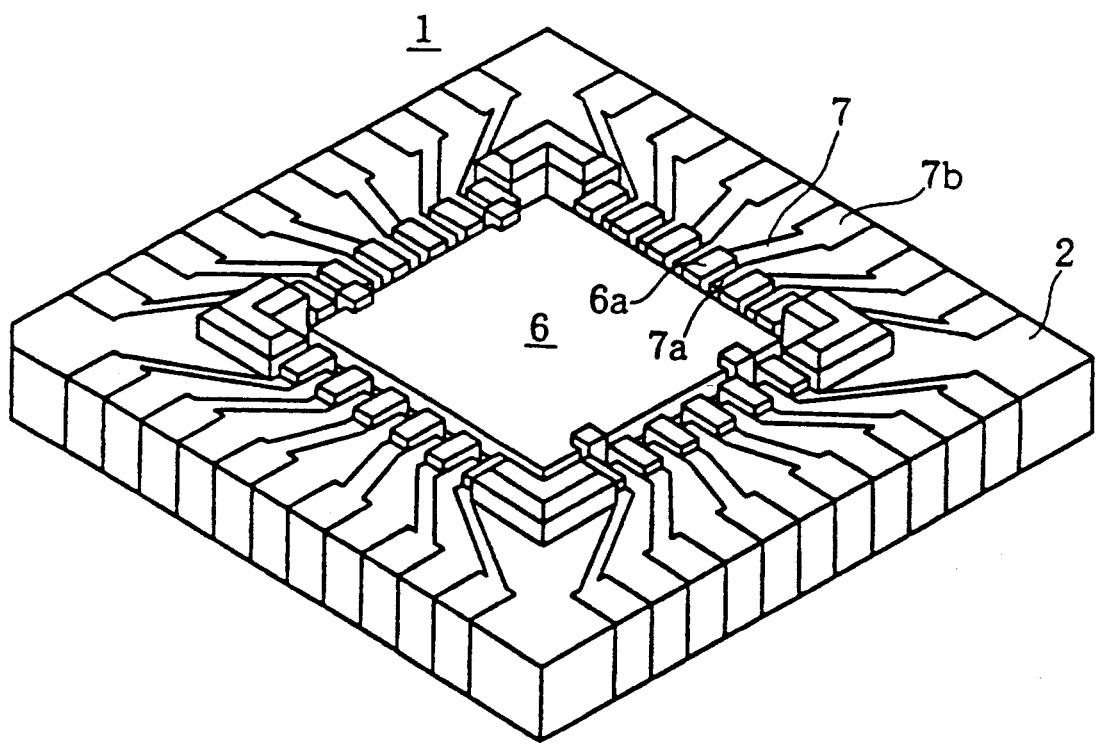
FIG. 4 is a perspective view of the IC carrier shown in FIG. 3.

As typically shown in FIG. 1, an IC carrier 1 is substantially constituted by a square frame 2 and includes an IC receiving recess 3 defined by the frame 2 at the central part of the latter. In addition, the IC carrier 1 includes a plurality of latch members 4 (two latch members in the shown case) in the frame 2, and the latch member 4 can disengageably be engaged with an IC package 6 when the latter is received in the IC receiving recess 3. As an example, each latch member 4 is constructed such that two torsion bars 5 are arranged to extend along two opposing sides of the IC receiving recess 3 and two latch arms 4a each having an engagement pawl 4b formed at the uppermost end thereof are caused to stand upright from each torsion bar 5 so as to allow the respective engagement pawls 4b to be engaged with and disengaged from the IC package 6.

When an IC package 6 is received in the IC receiving recess 3, it is brought into engagement with the latch member 4 along the whole edge thereof and a plurality of leads 6a project laterally from four sides or two sides of the IC package 6 and are held on the surface of the frame 2, whereby the IC package 6 is carried by the IC carrier 1. In the shown case, a plurality of leads 6a project from four sides of the IC package 6 and the foremost end of each lead 6a is held on the surface of the frame 2.

An electrical conductive pattern 7 is deposited on the surface of the frame 2 by employing a printed wiring process by which the respective leads 6a are held on the frame 2. The electrical conductive pattern 7 is in practice utilized in such a manner that all the leads 6a extending from the IC package 6 come in contact with one part of the electrical conductive pattern 7 via a plurality of first contact portions 7a to be described later, while a plurality of contacts 8a held by an IC socket 8 come into contact with another part of the electrical conductive pattern 7 via a plurality of second contact portions 7b to be described later.

FIGS. 5 to 8 show four examples each of which illustrates by way of sectional view that the electrical conductive pattern 7 comes into contact with leads 6a and contact pieces 8a. As is apparent from the drawings, the electrical conductive pattern 7 extends from the inwardly facing surface portion along the inner edge of the frame 2 along the surface of the frame to the outwardly facing surface portion along the outer edge portion of the same.

Figure 5:
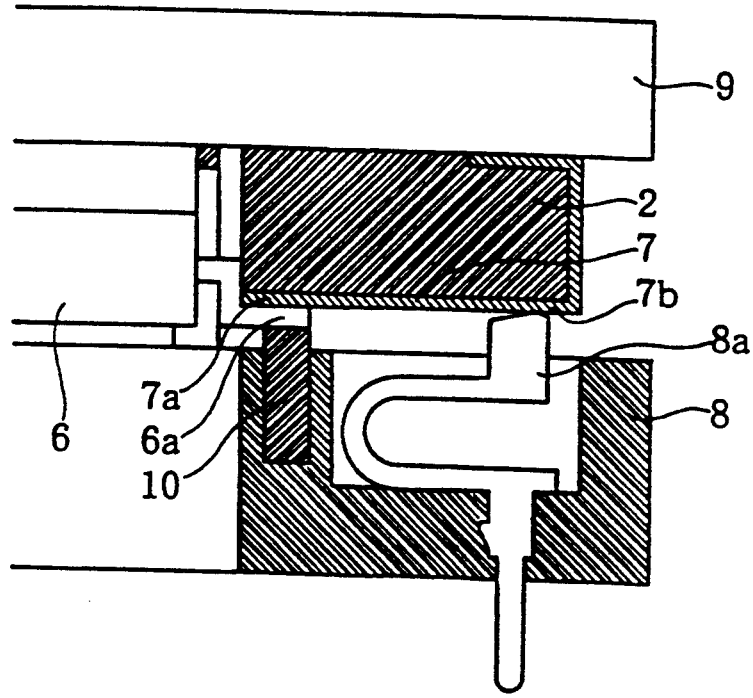
FIG. 5 is an enlarged fragmentary sectional view of an assembly consisting of an IC carrier, an IC package and an IC socket, particularly illustrating by way of example how the IC package is brought into contact with the IC socket.

In a first example as shown in FIG. 5, the foremost ends of the leads 6a extending from the IC package 6 are held against contact portions 7a on the surface portion along the inner edge of the frame 2, a plurality of such first contact portions 7a being connected to the inner end part of the electrical conductive pattern 7, and a plurality of second contact portions 7b are formed at outer end part of the electrical conductive pattern 7 and are contacted by the contact pieces 8a each extending from the IC package 8 and having a U-shaped contour.

The first contact portions 7a are spaced from each other at a small interval between adjacent contact portions, while the second contact portions 7b are spaced from each other at a larger interval between adjacent contact portions. With such construction, the leads 6a extending from the IC package 6 are brought into pressure contact with the first contact portions 7a arranged in the spaced relationship at a small interval equal to the interval between adjacent leads 6a, while the contact pieces 8a extending from the IC pocket 8 are likewise brought into pressure contact with the second contact portions 7b arranged in the spaced relationship at a large interval larger than an interval between adjacent leads 6a.

To establish correct contact of the electrical conductive pattern 7 with each contact piece 8a, the position of each second contact portion 7b is properly determined depending on the manner of depositing the electrical conductive pattern 7 on the frame 2. In FIG. 5, reference numeral 9 designates a retaining cover placed above the IC socket 8. The retaining cover 9 serves to depress the IC carrier 1 by its own dead weight in order to normally maintain reliable contact between the leads 6a and the contact pieces 8a.

Figure 6:
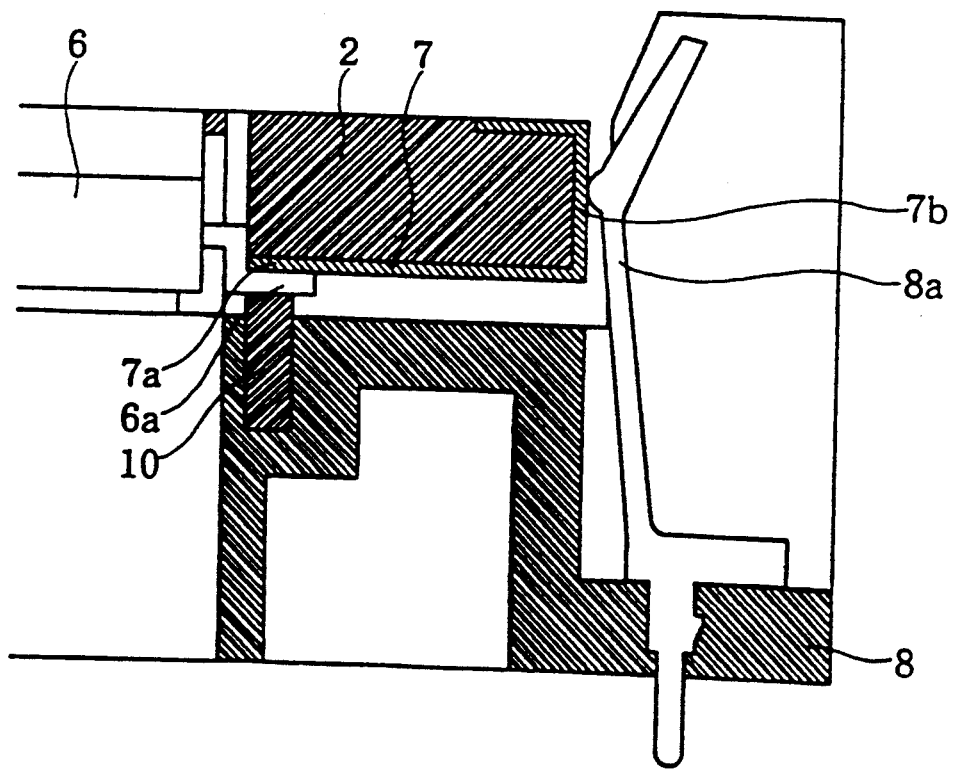
FIG. 6 is an enlarged fragmentary sectional view of an assembly consisting of an IC carrier, an IC package and an IC socket, particularly illustrating by way of another example how the IC package is brought into contact with the IC socket.

In a second example as shown in FIG. 6, the electrical conductive pattern 7 extends from the surface portion along the inner edge of the frame 2 and along the inwardly facing surface and to the outer peripheral surface of the latter and a plurality of second contact portions 7b are formed along the electrical conductive pattern 7 on the outer peripheral surface of the frame 2 and contacted by the contact pieces 8a standing upright from the IC socket 8. With the IC carrier 1 shown in FIG. 6, the IC package 6 is held by the contact force applied by all the contact pieces 8a.

Figure 7:
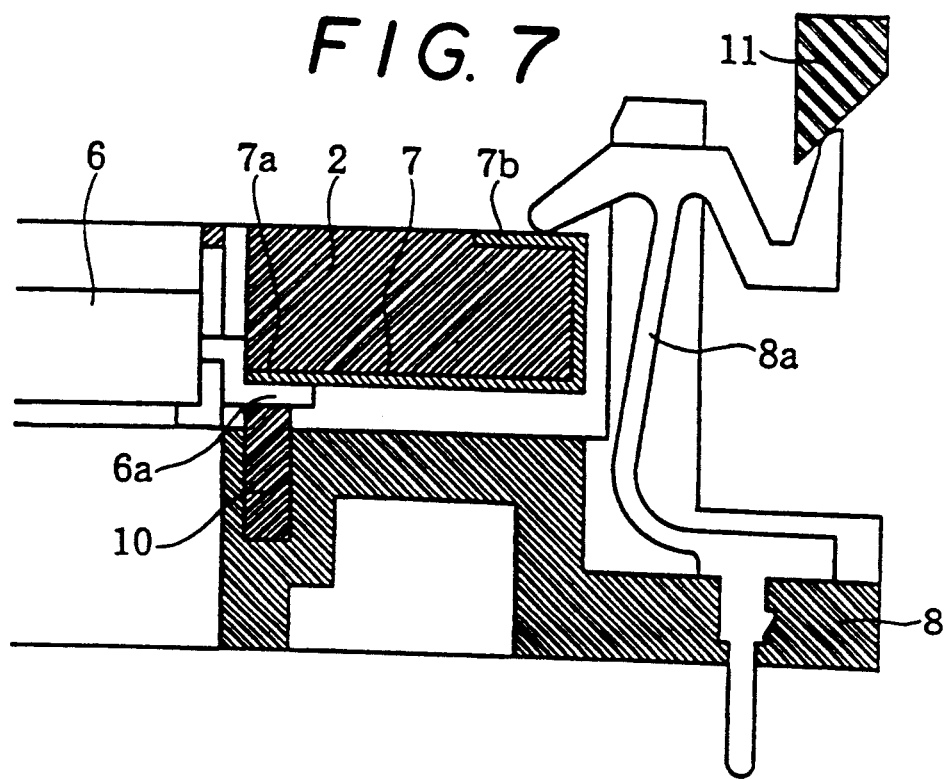
FIG. 7 is an enlarged fragmentary sectional view of an assembly consisting of an IC carrier, an IC package and an IC socket, particularly illustrating by way of a further example how the IC package is brought into contact with the IC socket.

In a third example as shown in FIG. 7, the electrical conductive pattern 7 extends from the surface portion along the inner edge of the frame 2 along the inwardly facing surface, the outer peripheral surface of the frame and also to the outwardly facing surface portion of the frame located opposite to the mentioned surface portion. In this example, a plurality of first contact portions 7a are formed at the inner end part of the electrical conductive pattern 7 and are contacted by the foremost ends of the leads 6a, while a plurality of second contact portions 7b are formed at an outer end of the electrical conductive pattern 7 located on the outwardly facing surface portion of the frame 2 and are contacted by the foremost ends of the contact pieces 8a standing upright from the IC socket 8. When a cover 11 arranged above the IC socket 8 is depressed, the contact pieces 8a are deformed and displaced away from the second contact portions 7b. On the contrary, when the cover 11 is released from the depressed state, the contacts 8a are displaced in the forward direction so that they are brought into pressure contact with the second contact portions 7b from above, and at the same time, the IC package 6 is held on the IC socket 8 by the contact force provided by the contact pieces 8a.

Figure 8:
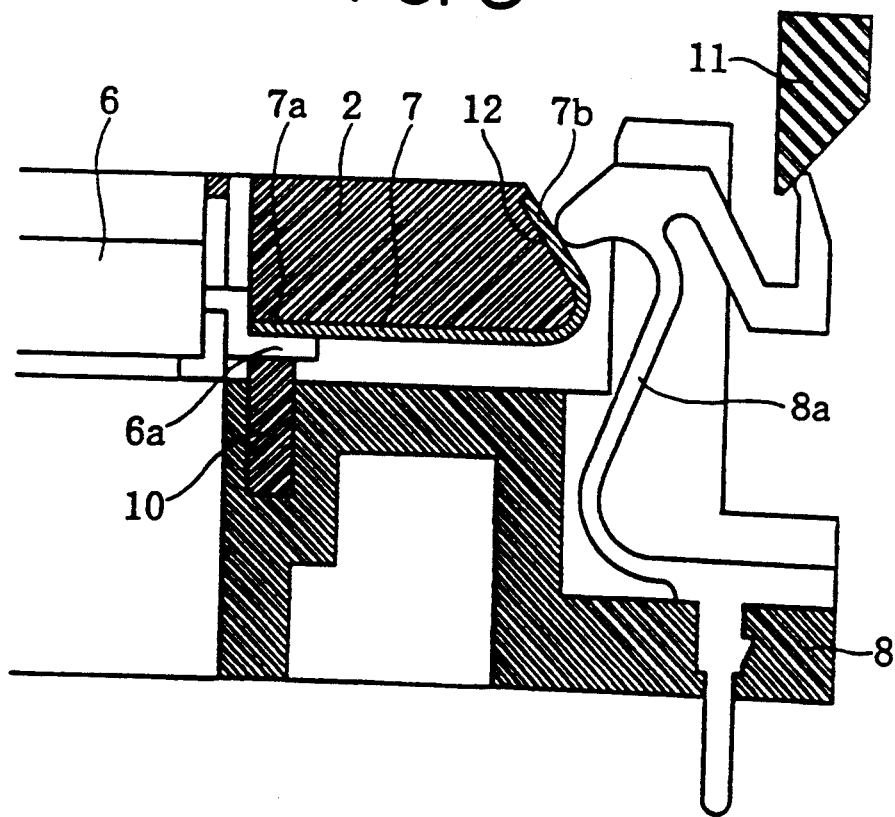
FIG. 8 is an enlarged fragmentary sectional view of an assembly consisting of an IC carrier, an IC package and an IC socket, particularly illustrating by way of a still further example how the IC package is brought into contact with the IC socket.

In a fourth example as shown in FIG. 8, the electrical conductive pattern 7 extends from the surface portion along the inner edge of the frame 2 along the inwardly facing surface to an inclined outer peripheral surface 12 of the frame and a plurality of second contact portions 7b are formed on the outer peripheral surface at outer end of the electrical conductive pattern 7 on the inclined outer peripheral surface 12 and are contacted by the foremost ends of the contact pieces 8a. This example is substantially same as the third example with the exception that the second contact portions 12 are formed on the inclined outer peripheral surface 12 of the frame 2.

An important thing common to the first to fourth examples as described above with reference to FIGS. 5 to 8 is that an elastic member 10 made of an electrical insulating material such as rubber or the like is embedded in on the IC socket 8 so as to support each lead 6a extending from the IC package 6 from below. When the frame 2 is depressed so as to cause each first contact portion 7a on the electrical conductive pattern 7 to come into pressure contact with the corresponding lead 6a, the elastic member 10 is compressed, and subsequently, the lead 6a is raised up by the reactive force appearing as a result of the release of compression of the elastic member 10, whereby an adequate contact pressure is reliably maintained between the leads 6a and the first contact portions 7a.

Of course, it is obvious that the electrical conductive pattern 7 is previously deposited on the surface of the frame 2 corresponding to each of the first to fourth examples as mentioned above.

While the present invention has been described above with reference to a single embodiment and four examples, it should of course be understood that the present invention should not be limited only to the embodiment and the examples but various changes or modifications may be made without departure from the scope of the present invention as defined by the appended claims.

What is claimed is:

1. In an integrated circuit carrier having a frame defining an integrated circuit receiving recess therein and having an inner peripheral surface, an outwardly facing surface, an inwardly facing surface and an outer peripheral surface, a plurality of latch members on said frame adapted to be engaged with and disengaged from an integrated circuit package received in said integrated circuit receiving recess with a plurality of leads extending from the integrated circuit package held on a surface of said frame so that the integrated circuit package is carried by said integrated circuit carrier by said leads; the improvement comprising:

an electrical conductive pattern on said frame having a plurality of conductor portions spaced around said frame, a plurality of first contact portions on one of said inwardly and outwardly facing surfaces of said frame adjacent said integrated circuit receiving recess for being contacted by corresponding contact ends of said leads extending from an integrated circuit package and each being in electrical contact with one end of a corresponding conductor portion, a plurality of second contact portions on said outer peripheral surface of said frame and each being in electrical contact with the other end of a corresponding conductor portion, said second contact portions being spaced from each other greater distances than said first contact portions;

whereby spring contacts on a socket for receiving said integrated circuit carrier thereon and spaced at larger intervals from each other than the leads on said integrated circuit package can be moved laterally of said outer peripheral surface into and out of contact with said second contact portions for making electrical connection to said integrated circuit package and permitting said integrated circuit carrier to be moved into and out of said socket.

2. In an integrated circuit carrier having a frame defining an integrated circuit receiving recess therein and having an inner peripheral surface, an outwardly facing surface, an inwardly facing surface and an outer peripheral surface, a plurality of latch members on said frame adapted to be engaged with and disengaged from an integrated circuit package received in said integrated circuit receiving recess with a plurality of leads extending from the integrated circuit package held on a surface of said frame so that the integrated circuit package is carried by said integrated circuit carrier by said leads; the improvement comprising:

said outer peripheral surface in inclined inwardly toward said integrated circuit receiving recess;

an electrical conductive pattern on said frame having a plurality of conductor portions spaced around said frame, a plurality of first contact portions on one of said inwardly and outwardly facing surfaces of said frame adjacent said integrated circuit receiving recess for being contacted by corresponding contact ends of said leads extending from an integrated circuit package and each being in electrical contact with one end of a corresponding conductor portion, a plurality of second contact portions on said inclined outer peripheral surface of said frame and each being in electrical contact with the other end of a corresponding conductor portion, said second contact portions being spaced from each other greater distances than said first contact portions;

whereby spring contacts on a socket for receiving said integrated circuit carrier thereon and spaced at larger intervals from each other than the leads on said integrated circuit package can be moved laterally of said outer peripheral surface into and out of contact with said second contact portions for making electrical connection to said integrated circuit package and holding said integrated circuit carrier in the socket, and for permitting said integrated circuit carrier to be moved into and out of said socket.

3. In an integrated circuit carrier having a frame defining an integrated circuit receiving recess therein and having an inner peripheral surface, an outwardly facing surface, an inwardly facing surface and an outer peripheral surface, a plurality of latch members on said frame adapted to be engaged with and disengaged from an integrated circuit package received in said integrated circuit receiving recess with a plurality of leads extending from the integrated circuit package held on a surface of said frame so that the integrated circuit package is carried by said integrated circuit carrier by said leads; the improvement comprising:

an electrical conductive pattern on said frame having a plurality of conductor portions spaced around said frame, a plurality of first contact portions on said inwardly facing surface of said frame adjacent said integrated circuit receiving recess for being contacted by corresponding contact ends of said leads extending from an integrated circuit package and each being in electrical contact with one end of a corresponding conductor portion, a plurality of second contact portions on said outwardly facing surface of said frame adjacent said outer peripheral surface and each being in electrical contact with the other end of a corresponding conductor portion, said respective conductor portions extending along said inwardly facing surface and said outer peripheral surface to respective second contact portions, said second contact portions being spaced from each other greater distances than said first contact portions;

whereby spring contacts on a socket for receiving said integrated circuit carrier thereon and spaced at larger intervals from each other than the leads on said integrated circuit package can be moved laterally of said outer peripheral surface over and downwardly into and out of contact with said second contact portions for making electrical connection to said integrated circuit package and holding said integrated circuit carrier in the socket and for permitting said integrated circuit carrier to be moved into and out of said socket.

* * * * *